April 7, 1970 G. H. TAUSCH 3,504,736
METHOD OF AND APPARATUS FOR PROTECTING ELECTRONICS
IN A TEMPERATURE COMPENSATING MEANS
Filed March 5, 1968
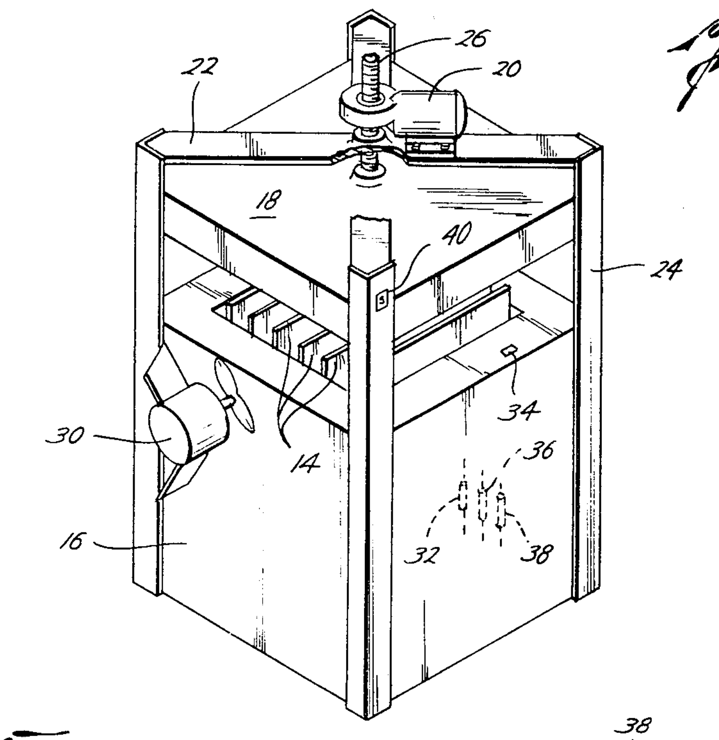
Fig. 1
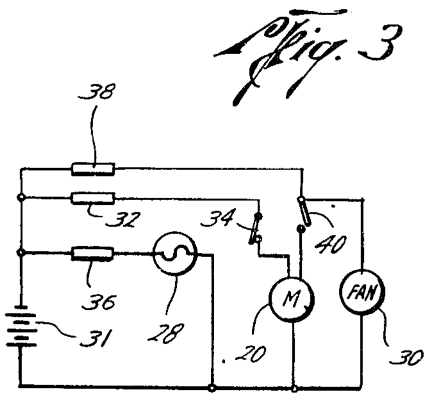
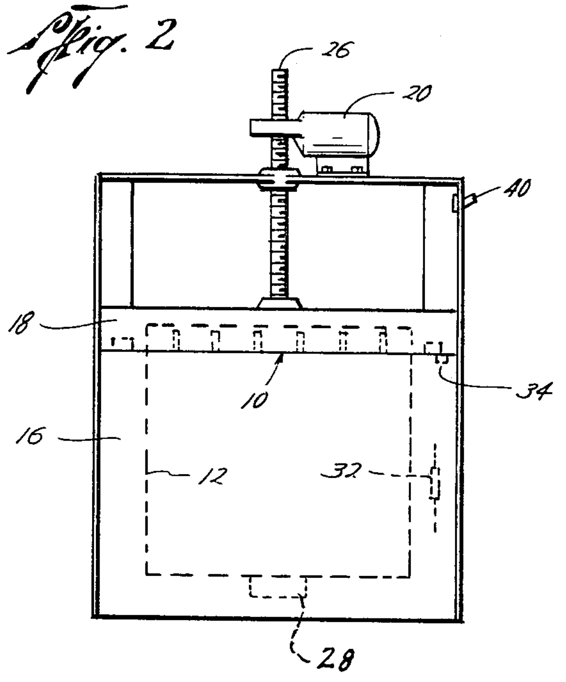
G. H. Tausch
INVENTOR.
BY [signatures]
ATTORNEYS United States Patent Office 3,504,736

Patented Apr. 7, 1970

3,504,736

METHOD OF AND APPARATUS FOR PROTECTING ELECTRONICS IN A TEMPERATURE COMPENSATING MEANS

Gilbert H. Tausch, Houston, Tex., assignor to Camco, Incorporated, Houston, Tex., a corporation of Texas Filed Mar. 5, 1968, Ser. No. 710,615
Int. Cl. F28f *17/00*
U.S. Cl. 165—2 6 Claims

ABSTRACT OF THE DISCLOSURE

A method and apparatus for protecting electronic components from undesired environmental changes by placing a heat transfer surface adjacent the components for transferring heat to and from the components, and when the temperature of the components decrease to a desired lower value enclosing the components and the heat transfer surface in an insulated container whereby the heat generated by the components will maintain the components above the lower limit, and when the temperature of the components increases retracting at least a portion of the insulation container away from the heat transfer surface. A metal heat transfer box enclosing the electronic components and an insulated container enclosing the box and components and when the temperature of the components increases to a desired value actuating means retracting at least a portion of the insulated container away from the box allowing the box to dissipate heat from the components, providing additional cooling of the exposed box when the container is retracted, and when the temperature of the components decreases closing the insulated container around the box and further heating the components when the temperature of the components reaches a predetermined desired low value.

Background of the invention

Various electronic components such as integrated circuits and magnetic core memory components operate satisfactorily over a limited temperature range. By way of example only, electronic components may be limited to operating satisfactorily in a range from 32 to a 140 degrees F. and this desired operation stability may be especially critical at low temperatures. The present invention provides a method and apparatus for insuring that the environmental temperature surrounding the electronic components is kept within a desired operational range with a minimum of power consumption.

Summary

The present invention consists of a method and apparatus for automatically insulating electronic components against an undesired heat transfer, but exposing the electronic components to a desirable heat transfer as the environmental temperature conditions to which the electronic components are subjected varies.

The present invention is directed to providing a temperature compensating enclosure for protecting electronic components from undesired environmental temperature changes by providing a heat transfer surface positioned adjacent the electronic components for transferring heat into and from the components, and an insulated container enclosing the components and the heat transfer surface with temperature sensing means measuring the temperature of the electronic components, and means responsive to the temperature sensing means for retracting a portion of the insulated container away from and moving it towards the heat transfer surface as the temperature increases and decreases predetermined amounts.

The present invention is also directed to providing auxiliary heating means in the insulated container which are actuated when the container is closed and on a predetermined low temperature for heating the electronic components, and further includes auxiliary cooling means which cool the metal heat transfer box when the insulated container is retracted away from the box.

The present invention is further directed to a method of and apparatus for protecting electronic components from undesired environmental temperature changes by enclosing the electronic components in a metal heat transfer box, enclosing the box with an insulated container, sensing the temperature of the electronic components, and retracting at least a portion of the insulated container away from the box as the temperature rises, and moving a portion of the insulated container towards the box when the temperature of the components decreases, and providing auxiliary heating and cooling when desirable to keep the components within a predetermined temperature range.

Brief description of the drawings

FIGURE 1 is a perspective drawing, partly in cross section illustrating one embodiment of the present invention, FIGURE 2 is a cross sectional view of the apparatus of FIGURE 1, and FIGURE 3 is an electrical schematic of the electrical control circuit of the present invention.

Description of the preferred embodiment

Referring now to the drawings, and particularly to FIGURES 1 and 2 the electrical components (not shown) to be protected have positioned adjacent thereto, a heat transfer surface 10 for transferring heat to and from the components. Preferably, the heat transfer surface 10 is a heat transfer enclosure such as an aluminum box 12 which is a good conductor of heat and thus will readily transfer heat when desired. If desired, a plurality of heat transfer ribs 14 may be provided on the heat transfer surface 10, preferably the top, for more readily transferring heat therefrom.

The electrical components themselves will generate heat in their operation and in the event of high surrounding environmental temperatures it may become desirable to remove heat from the electronic components in the box 12 to maintain the components below a desirable upper temperature limit. In this event, the excellent heat transfer characteristics of the box 12 and ribs 14 act to dissipate unwanted heat.

However, in event that the environmental temperature limit decreases to a predetermined value, it is necessary to insulate the components and the heat transfer enclosure 12 against transfer of the heat generated by the electronics. Thus, as shown in FIGURES 1 and 2 an insulated container 16 is provided which encloses the heat transfer enclosure 12 and utilizes the heat generated by the electronics in the enclosure 12 to keep the electronics above their lower desired operating temperature value and prevents heat transfer through the heat transfer enclosure 12 during periods of low environmental temperatures. The insulated container 16 may be of any suitable insulating material, for example Styrofoam or urethane foam insulation has been found satisfactory.

However, as the environmental temperatures increase, it is necessary to retract at least a portion of the insulated container away from the heat transfer enclosure 12 to dissipate the heat of the electronic components therein to keep the operating temperatures below a desired maximum. While, of course, one or all of the sides of the container may be retracted from the heat transfer enclosure 12, by way of example only, the top 18 of the insulated container 16 is here shown as being retractable away from the enclosure 12 and movable towards the enclosure 12 for opening and closing the insulated container 16 as temperature conditions warrant.

Thus, a reversible motor 20 is provided on suitable supports 22 which are in turn supported by corner supports 24 which may be angle iron supports which also serve the function of providing an interior track for guiding the movement of the top 18 as it moves to and from the box 12. A worm screw 26 is provided connected and geared to the reversible motor 20 and connected to the top 18 of the insulated container 16. Thus as the motor 20 is actuated and reversed the top 18 may be moved toward the heat transfer box 12 or retracted therefrom.

In some instances it may be desirable under severe environmental temperature conditions to provide suitable auxiliary heating and cooling means for providing additional heating when the insulated container 16 is closed or to provide additional cooling when the insulated container 16 is opened. Thus, as seen in FIGURE 2, a heating coil 28 may be provided either inside of the heat transfer box 12 or adjacent thereto to provide additional heating when necessary, and as best seen in FIGURE 1 additional cooling means, for example, a fan 30 may be provided for directing additional cooling air across the heat transfer surface 10 as desired.

Referring now to FIGURE 3, a control circuit is shown for automatic operation of the apparatus on a minimum of power consumption such as from a battery 31 or the power supply (not shown) operating the electronic components. Thus, a suitable temperature sensing means and switch such as a bi-metallic switch 32 is provided which may be positioned, as best seen in FIGURES 1 and 2 inside of the insulated container 16 for sensing the temperature of the electronic components and which is electrically connected between the battery 31 and the reversible motor 20 through a normally closed limit switch 34. Thus, when the temperature sensing switch 32 senses a predetermined low temperature, for example 40 degrees, the motor 20 is actuated in a direction to move the insulated container top 18 downwardly enclosing the heat transfer box 12 whereby the heat generated by the electronics therein may be used to maintain the temperature in the box 12 above the desired minimum. When the top 18 is moved downwardly and seals off the heat transfer box 12 the top 18 will contact the limit switch 34 which will be opened when contacted by the top 18 thereby stopping the motor 20.

In the event that additional heating is desired to maintain the temperature in the insulated container 16 above the desired minimum, an auxiliary heating coil 28 may be actuated. While, of course, the auxiliary heating coil 28 may be actuated by the first temperature sensing means 32 a second temperature sensing means and switch 36 may be provided set at a lower actuating temperature, for example 35 degrees, which will automatically energize the heating element 28 when temperature conditions indicate that additional heating is required.

However, when the environmental temperature increases above a predetermined value, for example 80 degrees F., a third temperature sensing means such as a bimetallic switch 38 is actuated, and which is electrically connected between the battery 31 and the reversible motor 20 to actuate the motor through a normally closed limit switch 40 to cause the motor 20 to retract the insulated container top 18 away from the heat transfer box 12 allowing the heat in the box to be dissipated. When the top 18 is raised to its uppermost position it contacts limit switch 40 opening the circuit to the motor 20 thereby deactuating the motor 20. And if additional cooling is required, the temperature sensing switch 38 can also be connected to and actuate an auxiliary cooling system such as fan 30 which blows air across the top of the heat transfer box 12 and the ribs 14 to more quickly dissipate heat from the box 12.

In operation, and assuming that it is desired to keep the electronic components in the heat transfer box 12 within a limited temperature range, for example 32 to a 140 degrees F., the insulated container will be automatically closed to insulate the box 12 and the enclosed electronic components from undesired low environmental temperatures, but will automatically be opened to expose the box 12 to a desirable heat dissipation transfer. Thus, when the temperature sensing means or switch 32 measures a first predetermined low temperature, for example 40 degrees, the switch 32 will close actuating the motor 20 through the normally closed limit switch 34 to close the top 18. A further decrease in the temperature, for example to 35 degrees, will actuate temperature sensing switch 36 to actuate auxiliary heating coil 28. In the event the environmental temperature conditions increase, switch 36 will open turning off the auxiliary heating power 28. And in the event that the temperature rises to a predetermined high level, for example 80 degrees, temperature sensing switch 38 is actuated to reverse the motor 20 through a normally closed limit switch 40 to retract the top 18, which motor is deenergized when the top 18 contacts and opens limit switch 40. Simultaneously, the auxiliary cooling such as fan 30 is actuated to provide additional cooling across the heat transfer box 12. In the event the temperature again decreases the temperature sensing switch 38 will open shutting off the fan 30, and in the event the temperature further decreases to below 40 degrees, the closing cycle will again be actuated.

While the method of protecting the electronic components from undesirable temperature changes by maintaining them in an environment having limited range of temperatures is readily apparent from the foregoing discussion of the preferred embodiment of the apparatus, the method comprehends placing a heat transfer surface adjacent the components, and when the temperature of the components decreases to a predetermined first low value enclosing the components and the heat transfer surface in an insulated container whereby the heat generated by the components will maintain the components above a predetermined temperature and when the temperature of the components increases to a predetermined upper value removing at least a portion of the insulation container away from the heat transfer surface. The method further comprehends cooling the heat transfer surface when the insulated container is retracted from the heat transfer surface and further includes the step of heating the components with auxiliary heating when the heat transfer surface is enclosed and when the temperature of the components reach a predetermined minimum.

The present invention is well adapted to carry out the objections and attain the ends and advantages mentioned as well as others inherent therein. While a presently preferred embodiment is given for the purpose of disclosure, numerous changes in the detail of construction and steps of the method and arrangement of parts may be made which will readily suggest themselves to those skilled in the art and which are encompassed in the spirit of the invention and the scope of the appended claims.

What is claimed is:

1. A temperature compensating enclosure for protecting electronic components from undesired environmental temperature changes comprising,
   - a heat transfer surface positioned adjacent said electronic components for transferring heat to and from said components,
   - an insulated container enclosing said components and said heat transfer surface,
   - temperature sensing means measuring the temperature of said electronic components,
   - means responsive to the temperature sensing means for moving a portion of said insulation away from and toward said heat transfer surface as the temperature increases and decreases a predetermined amount, and
   - fan means cooling the exposed portion of the metal heat transfer box when the insulated container is retracted away from the box.

2. A method of protecting electronic components from undesirable temperature changes by providing an environment having a limited range of temperature comprising,
placing said components in a metal heat transfer box,
placing said enclosure in an insulated container,
when the temperature of the components increases to a predetermined upper value removing at least a portion of the insulated container away from the box thereby allowing the box to dissipate heat from the components,
when the temperature of the components decreases to a predetermined lower value closing the container around the box whereby the heat generated by the components will be insulated against dissipation, and
blowing air against the metal box for cooling the exposed box when the insulated container portion is retracted from the box.

3. A temperature compensating enclosure for protecting electronic components from undesired environmental temperature changes comprising,
a heat transfer surface positioned adjacent said electronic components for transferring heat to and from said components,
an insulated container enclosing said components and said heat transfer surface,
temperature sensing means measuring the temperature of said electronic components,
means responsive to the temperature sensing means for moving a portion of said insulation away from and toward said heat transfer surface as the temperature increases and decreases a predetermined amount, and
heating means in said container actuated on a predetermined low temperature by said temperature sensing means.

4. A temperature compensating enclosure for protecting electronic components from undesired environmental temperature changes comprising,
a metal heat transfer box enclosing said electronic components,
an insulator container enclosing said box,
temperature sensing means responsive to the temperature of said electronic components,
electrical power means connected to a portion of said insulated container for moving said portion away from and towards said box, said power means connected to and actuated by said temperature sensing means upon predetermined high and low temperatures, and
heating means in said container actuated on a predetermined low temperature by said temperature sensing means.

5. A method of protecting electronic components from undesirable temperature changes by maintaining an environment having a limited range of temperature comprising,
placing a heat transfer surface adacent said components,
when the temperature of the components decreases to a predetermined lower value enclosing the components and the heat transfer surface in an insulated container whereby the heat generated by the components will maintain the components above a predetermined temperature,
when the temperature of the components decreases to to a predetermined upper value removing at least a portion of insulation container away from the heat transfer surface, and
heating the electronic components when the temperature of the components reaches a predetermined minimum.

6. A method of protecting electronic components from undesirable temperature changes by providing an environment having a limited range of temperature comprising,
placing said components in a metal heat transfer box,
placing said enclosure in an insulated container,
when the temperature of the components increases to a predetermined upper value removing at least a portion of the insulated container away from the box thereby allowing the box to dissipate heat from the components,
when the temperature of the components decreases to a predetermined lower value closing the container around the box whereby the heat generated by the components will be insulated against dissipation, cooling the exposed box when the insulated container portion is retracted from the box, and
heating the components when the temperature of the components reaches a predetermined minimum.

References Cited

UNITED STATES PATENTS

| | | | |
|---|---|---|---|
| 3,006,611 | 10/1961 | Isham | 165—86 |
| 3,192,069 | 6/1965 | Vogt et al. | 165—32 |

LLOYD L. KING, Primary Examiner

C. SUKALO, Assistant Examiner

U.S. Cl. X.R.

165—39, 48, 86